(12) United States Patent
Abraham et al.

(10) Patent No.: US 10,268,968 B2
(45) Date of Patent: Apr. 23, 2019

(54) JOSEPHSON JUNCTIONS FOR IMPROVED QUBITS

(71) Applicant: INTERNATIONAL BUSINESS MACHINES CORPORATION, Armonk, NY (US)

(72) Inventors: David W. Abraham, Croton, NY (US); Josephine B. Chang, Ellicott City, MD (US); Jay M. Gambetta, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/813,441

(22) Filed: Nov. 15, 2017

(65) Prior Publication Data

US 2019/0042963 A1 Feb. 7, 2019

Related U.S. Application Data

(63) Continuation of application No. 15/669,139, filed on Aug. 4, 2017.

(51) Int. Cl.
| | | |
|---|---|---|
| *G06N 99/00* | (2010.01) | |
| *H01L 27/18* | (2006.01) | |
| *H01L 39/02* | (2006.01) | |
| *H01L 39/04* | (2006.01) | |
| *H01L 39/22* | (2006.01) | |
| *H01L 39/24* | (2006.01) | |
| *G11C 11/44* | (2006.01) | |
| *G11C 16/02* | (2006.01) | |
| *H03K 19/195* | (2006.01) | |

(52) U.S. Cl.
CPC ............ *G06N 99/002* (2013.01); *G11C 11/44* (2013.01); *G11C 16/02* (2013.01); *H01L 27/18* (2013.01); *H01L 39/025* (2013.01); *H01L 39/045* (2013.01); *H01L 39/2493* (2013.01); *H03K 19/1952* (2013.01); *H01L 39/223* (2013.01)

(58) Field of Classification Search
CPC . H01L 39/223; H01L 39/025; H01L 39/2493; H01L 39/045; H01L 27/18; G11C 11/44
See application file for complete search history.

(56) References Cited

U.S. PATENT DOCUMENTS

| | | | | |
|---|---|---|---|---|
| 9,806,711 B1 * | 10/2017 | Abdo | ...................... | H03K 17/92 |
| 2009/0062128 A1 * | 3/2009 | Harada | .................. | C23C 14/067 |
| | | | | 505/238 |
| 2015/0241481 A1 * | 8/2015 | Narla | ...................... | H03F 19/00 |
| | | | | 324/602 |

(Continued)

OTHER PUBLICATIONS

David W. Abraham et al., "Josephson Junctions for Improved Qubits", Related Application; U.S. Appl. No. 15/669,139, filed Aug. 4, 2017.

(Continued)

*Primary Examiner* — Ngan V Ngo
(74) *Attorney, Agent, or Firm* — Cantor Colburn LLP; Rabin Bhattacharya

(57) ABSTRACT

A technique relates to a superconducting qubit. A Josephson junction includes a first superconductor and a second superconductor formed on a non-superconducting metal. A capacitor is coupled in parallel with the Josephson junction.

11 Claims, 18 Drawing Sheets

(56) References Cited

U.S. PATENT DOCUMENTS

| | | | |
|---|---|---|---|
| 2015/0263736 A1* | 9/2015 | Herr | H03K 3/38 |
| | | | 326/4 |
| 2016/0364653 A1* | 12/2016 | Chow | G06N 99/002 |
| 2017/0033273 A1* | 2/2017 | Chang | H01L 39/025 |
| 2017/0072504 A1* | 3/2017 | Abraham | G06N 99/002 |
| 2017/0089961 A1* | 3/2017 | Abdo | G01V 8/005 |
| 2017/0093015 A1* | 3/2017 | Abdo | G02B 5/208 |
| 2018/0012932 A1* | 1/2018 | Oliver | H01L 24/05 |
| 2018/0101785 A1* | 4/2018 | Abdo | G01R 29/0814 |

OTHER PUBLICATIONS

List of IBM Patents or Patent Applications Treated As Related; (Appendix P), Filed Nov. 15, 2017; pp. 1-2.

\* cited by examiner

FIG. 1
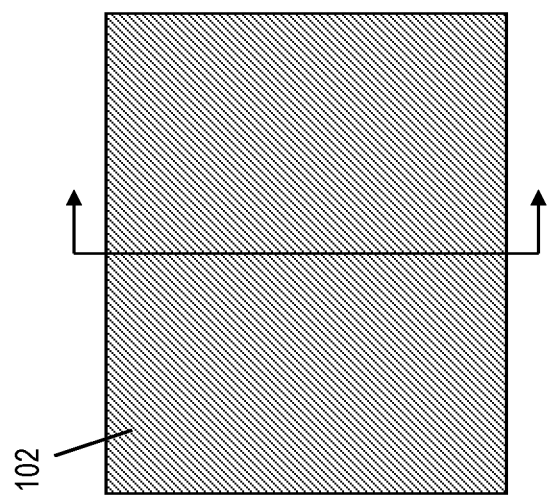
102
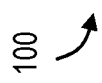
100

PROVIDING A JOSEPHSON JUNCTION, THE JOSEPHSON JUNCTION INCLUDING A NON-SUPERCONDUCTING METAL FORMED BETWEEN A FIRST SUPERCONDUCTOR AND A SECOND SUPERCONDUCTOR 1702

COUPLE A CAPACITOR IN PARALLEL WITH THE JOSEPHSON JUNCTION 1704

1800

PROVIDE A SUPERCONDUCTING QUBIT, THE SUPERCONDUCTING QUBIT INCLUDING A JOSEPHSON JUNCTION HAVING A FIRST SUPERCONDUCTOR, A SECOND SUPERCONDUCTOR, AND A NON-SUPERCONDUCTING METAL 1802

COUPLE A READOUT RESONATOR TO THE SUPERCONDUCTING QUBIT 1804

JOSEPHSON JUNCTIONS FOR IMPROVED QUBITS

DOMESTIC PRIORITY

This application is a continuation of U.S. application Ser. No. 15/669,139, titled "JOSEPHSON JUNCTIONS FOR IMPROVED QUBITS", filed Aug. 4, 2017, the contents of which are incorporated by reference herein in its entirety.

STATEMENT REGARDING FEDERALLY SPONSORED RESEARCH OR DEVELOPMENT

This invention was made with Government support under Contract No.: H98230-13-D-0173 awarded by the National Security Agency. The Government has certain rights to this invention.

BACKGROUND

The present invention generally relates to superconducting devices. More specifically, the present invention relates to Josephson junctions for improved qubits.

Several physical objects have been suggested as potential implementations of qubits. However, solid-state circuits, and superconducting circuits in particular, are of great interest as they offer scalability, which allows circuits to be formed with a larger number of interacting qubits. Superconducting qubits are typically based on Josephson junctions. A Josephson junction is two superconductors coupled by, for example, a thin insulating barrier. A Josephson junction can be fabricated by means of an insulating tunnel barrier, such as $Al_2O_3$, between superconducting electrodes. For such Josephson junctions, the maximum allowed supercurrent is the critical current $I_c$. Superconducting tunnel junctions (also referred to as Josephson junctions) used in superconducting quantum chips exhibit a Josephson inductance, which is equivalent to a conventional inductor within the circuit except for the ability to provide superconducting current.

SUMMARY

Embodiments of the present invention are directed to a superconducting qubit. A non-limiting example of the superconducting qubit includes a Josephson junction including a first superconductor and a second superconductor formed on a non-superconducting metal, and a capacitor in parallel with the Josephson junction.

Embodiments of the present invention are directed to method of fabricating a superconducting qubit. A non-limiting example of the method includes providing a Josephson junction, the Josephson junction including a first superconductor and a second superconductor formed on a non-superconducting metal, and coupling a capacitor in parallel with the Josephson junction.

Embodiments of the present invention are directed to a superconducting qubit. A non-limiting example of the superconducting qubit includes a Josephson junction including a non-superconducting metal formed between a first superconductor and a second superconductor, and a capacitor in parallel with the Josephson junction.

Embodiments of the present invention are directed to method of fabricating a superconducting qubit. A non-limiting example of operating the method includes providing a Josephson junction, the Josephson junction including a non-superconducting metal formed between a first superconductor and a second superconductor, and coupling a capacitor in parallel with the Josephson junction.

Embodiments of the present invention are directed to a method of forming a microwave device. A non-limiting example of the method includes providing a superconducting qubit, the superconducting qubit including a Josephson junction having a first superconductor, a second superconductor, and a non-superconducting metal, and coupling a readout resonator to the superconducting qubit.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a top view of fabricating the superconducting qubit according to embodiments of the present invention;

FIG. 17 depicts a flow chart of a method of fabricating a superconducting qubit according to embodiments of the present invention.

Figure 2:
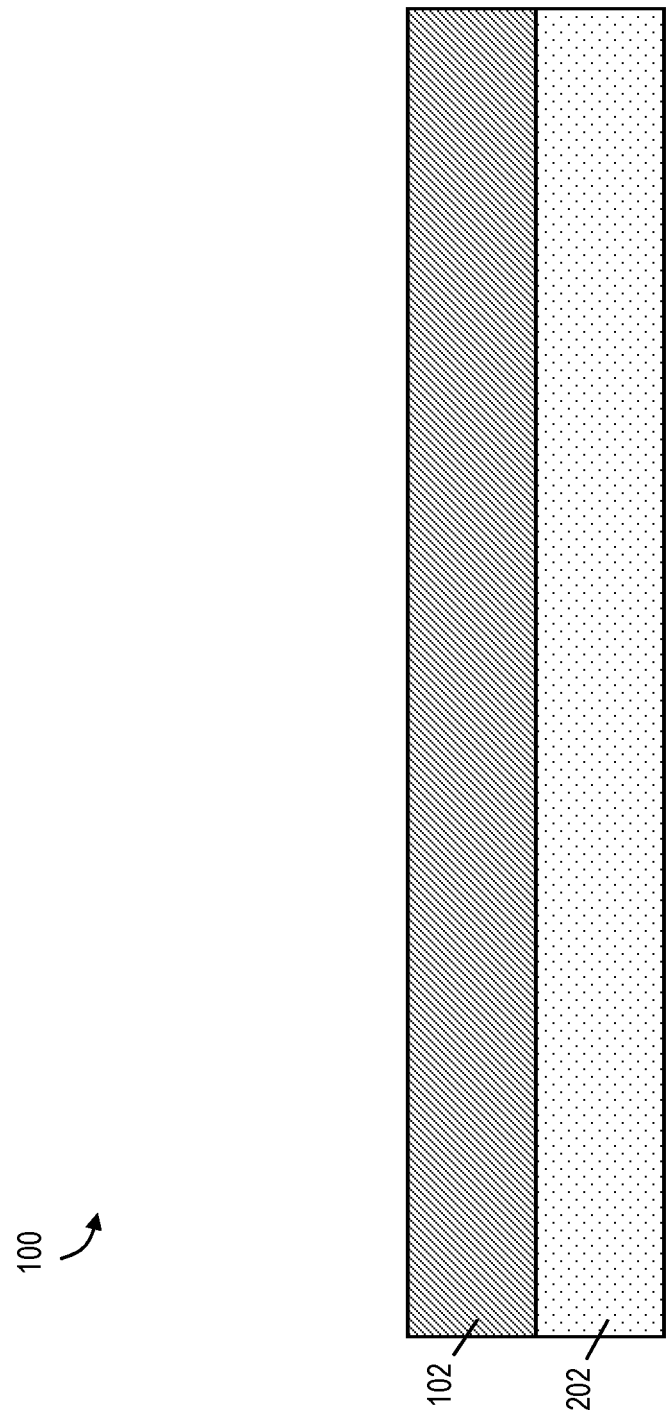
FIG. 2 depicts a cross-sectional view of FIG. 1 according to embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, for gate-based superconducting quantum computing, it is important that the frequency of the qubits (forming the circuits) are well controlled, and have tight distributions. In the state-of-the art, qubits use oxide tunnel junctions to form a Josephson junction, and the Josephson junction provides non-linear inductance in the circuit/device. A shunt capacitor is fabricated and creates non-linear oscillator which serves as a qubit. The frequency of this qubit is given by the expression $$f = \frac{1}{2\pi\sqrt{LC}}$$

where L is the non-linear inductance of the Josephson junction and C is shunt capacitance. Each Josephson junction has a superconducting critical current $I_c$, and the Josephson inductance is related to $I_c$ by the expression $$L_J = \frac{\phi_0}{2\pi I_c},$$

where $\square_0$ is the flux quantum. Combining these two expressions, the tight frequency distribution (which refers to the difference in frequency of nominally identical qubits) is due to variability in the critical current of the Josephson junction and of the shunt capacitance C. The frequency spread in a population of nominally identical qubits is known to originate as a spread in critical current ($I_c$) of the Josephson junctions as opposed to the capacitance which is formed by standard lithographic and patterning methods. In addition, it is desirable to increase the coherence time of the qubit by reducing all sources of energy loss from the qubit either from something internal to the device or to external systems. It is believed that inclusion of dielectrics (such as the oxide used for the tunnel barrier itself) can lead to additional losses and associated reduction of coherence times.

The spreads (i.e., differences) in critical current $I_c$ (or similarly the difference in resistance) of the junctions varies as approximately $1/\sqrt{A}$, where A is the area of the junction. This dependence has been observed in Josephson junctions, and also in magnetoresistive random access memory (MRAM) tunnel junctions in which both $MgO_2$ and $AlO_2$ have been used as barriers. This indicates that the dependence on area A for the value of the critical current $I_c$ is a universal behavior. Although this problem has been studied for decades, virtually no progress has been reported in reducing spreads (i.e., differences in the critical current L) for a given sized Josephson junction. In the case of quantum computing in which many qubits must be made, with tight control on spreads, this issue becomes much more important. Although it could be possible that further progress can be made in controlling oxide junction spreads (i.e., controlling the differences in the oxide junctions among Josephson junction devices each designed with a given size Josephson junction), exploration of alternatives takes on new urgency if a practical quantum computer is to be made.

Turning now to an overview of the aspects of the invention, one or more embodiments of the invention address the above-described shortcomings of the prior art by, instead of using superconducting insulator superconducting Josephson junctions for the transmon qubits, using superconducting-normal-superconducting Josephson junctions. Initially, it may or may not appear that the junction properties are similar for the two cases, i.e., with the same phase/voltage relationship for both. However, the origin of fluctuations in critical current $I_c$ for nominally identical superconducting insulator superconducting junctions is believed to originate in subtle differences in the tunnel barrier thickness, accentuated by the steep exponential dependence of tunneling current $I_c$ on barrier thickness. In addition, $I_c$ fluctuations can be attributed to defects within the oxide barrier or at the oxide/metal interface, often referred to as two-level systems (TLS). In accordance with embodiments of the present invention, the characteristic length scale for decay of the order parameter can be 10-100 times longer for superconducting normal metal superconducting junctions than for superconducting insulator superconducting junctions. Thus, control of critical current $I_c$ is proportionally easier to obtain by having a superconducting qubit formed of a capacitor and superconducting normal metal superconducting Josephson junction. The normal metal is not superconducting metal, which means the normal metal (non-superconducting metal) does not become superconducting at low temperatures (such as at or below 9 Kelvin (K), 4K, etc.). The normal metal is utilized as the tunneling metal in place of the dielectric material such as an oxide layer. Nominally identical superconducting qubits having Josephson junctions made with superconducting normal metal superconducting junctions have a smaller spread of critical current $I_c$ (which means the critical current $I_c$ is about the same (i.e., tightly distributed)) than for nominally identical superconducting qubits having Josephson junctions made with superconducting insulator superconducting junctions. By eliminating the oxide tunnel barrier and replacing it with a normal metal, the coherence is improved due to the removal of TLS-containing dielectric material.

Turning now to a more detailed description of aspects of the present invention, FIGS. 1-8 depict fabrication of a superconducting qubit 100 according to embodiments of the present invention. FIG. 1 depicts a top view of fabricating the superconducting qubit 100 according to embodiments of the present invention. FIG. 2 depicts a cross-sectional view of FIG. 1 according to embodiments of the present invention. Fabrication of superconducting qubit 100 uses a contacts first process, in which the contacts (i.e., superconducting electrodes) are deposited before the tunnel barrier material which is a non-superconducting material.

A superconducting material 102 is formed on top of a substrate 202. Non-limiting examples of the superconducting material 102 include material such as niobium (Nb), aluminum (Al), titanium nitride (TiN), and other suitable superconductors.

Non-limiting examples of suitable materials for the substrate 202 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Figure 3:
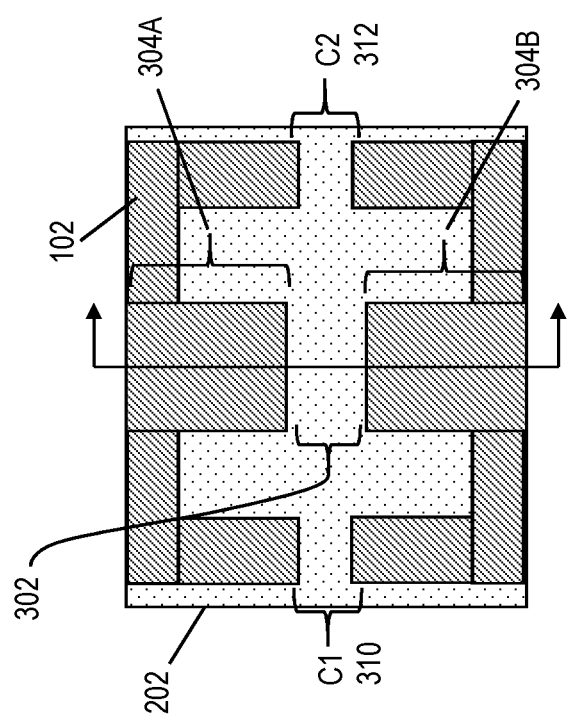
FIG. 3 depicts a top view of fabricating a superconducting qubit according to embodiments of the present invention.
Figure 4:
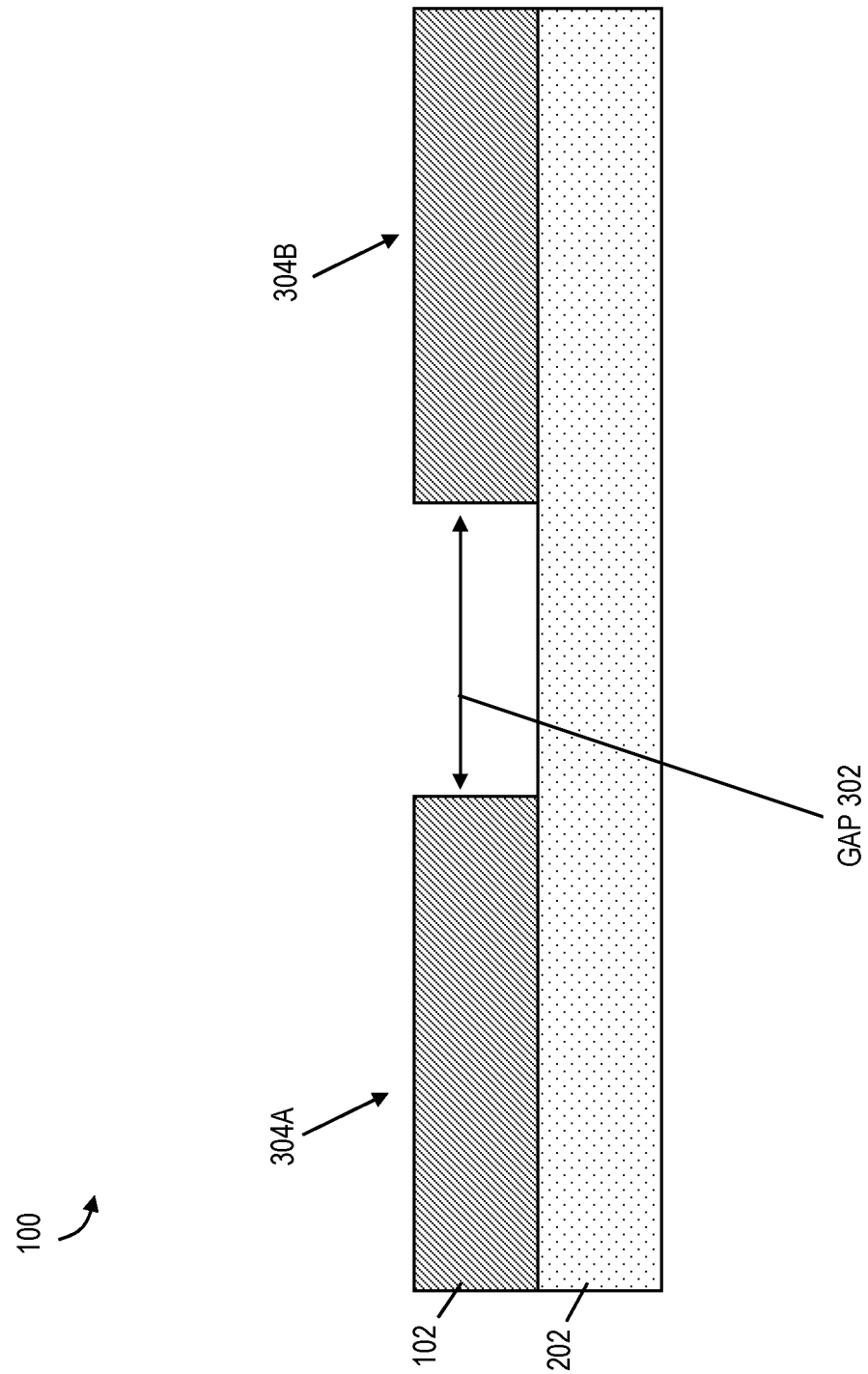
FIG. 4 depicts a cross-sectional view of FIG. 3 according to embodiments of the present invention.

FIG. 3 depicts a top view of fabricating the superconducting qubit 100 according to embodiments of the present invention. FIG. 4 depicts a cross-sectional view of FIG. 3 according to embodiments of the present invention. The superconducting material 102 of the superconducting qubit 100 is patterned. Although each element associated with the superconducting qubit 100 is not shown so as not to obscure the figure, the fabrication process patterns readout resonators, ground plane, capacitors, and/or junction contacts with a single-step lithography and subsequent etching. As one example, lithography can be performed to deposit and pattern a resist layer (which can be positive photoresist or negative photoresist) in the desired pattern on top of superconducting material 102. Accordingly, the etching of the superconducting material 102 (e.g., TiN or Nb) can be accomplished with $Cl_2$ or $BCl_3$ etchants during reactive ion etching (RIE). Etch of the TiN can also be accomplished with a wet-etch such as "Standard Clean 1" ($NH_4OH + H_2O_2$).

The patterning of the superconducting material 102 results in a space 302 between superconducting electrodes 304A and 304B. The space 302 is in preparation for depositing the non-superconducting material (i.e., normal metal). The distance of the space 302 (i.e., gap) can range from about 0.1-10 microns (□m). Additionally, the patterning of the superconducting material 102 results in capacitor 310 C1 and capacitor 312 C2 which are the shunt capacitor for the superconducting qubit 100. In some embodiments of the present invention, both capacitors 310 C1 and 312 C2 can be utilized. In some embodiments of the present invention, only one of the capacitors 310 C1 or 312 C2 can be utilized such that only one capacitor is patterned.

Figure 5:
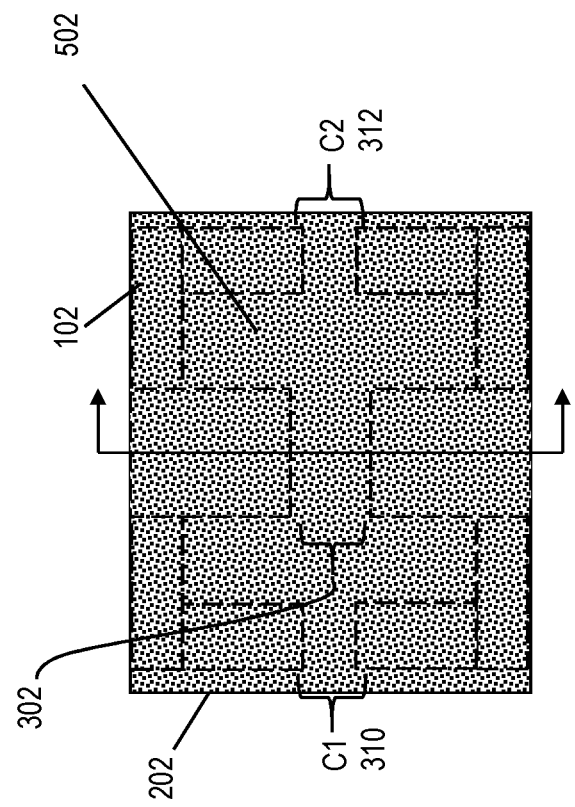
FIG. 5 depicts a top view of fabricating a superconducting qubit according to embodiments of the present invention.
Figure 6:
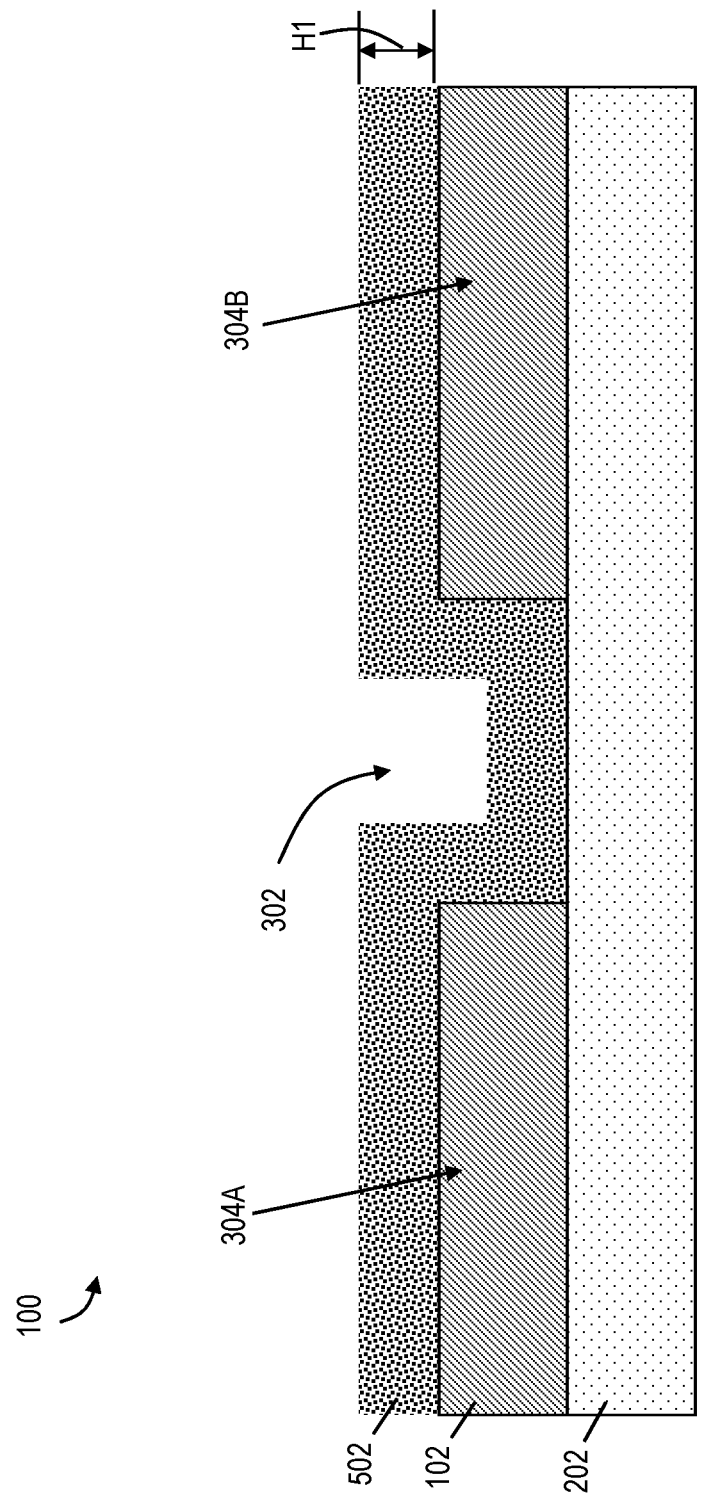
FIG. 6 depicts a cross-sectional view of FIG. 5 according to embodiments of the present invention.

FIG. 5 depicts a top view of fabricating the superconducting qubit 100 according to embodiments of the present invention. FIG. 6 depicts a cross-sectional view of FIG. 5 according to embodiments of the present invention. As can been seen, a non-superconducting metal 502 is deposited on top of the superconducting material 102 and the substrate 202. The non-superconducting metal 502 is deposited in the space 302 to become the tunnel barrier. For example, the surface of the superconducting qubit 100 can be cleaned in-situ and then metal deposition of the non-superconducting metal 502 is performed. The non-superconducting metal 502 can be copper (Cu), platinum (Pt), etc. Other examples of other suitable tunneling non-superconducting metal 502 can include Au, Ag, Pd, and so on. The choice of which metal pair is used for the superconducting and normal metals will be driven by several factors. First, the cleanliness of the materials can be a factor, and particularly the normal metal is important where the quantity of interest is the coherence length which is in part governed by the mean free path of electrons in the material. In addition, the desired operating temperature (as a factor) will set a minimum limit on the superconducting transition temperature. Finally, ease of processing and the coexistence of the two metals can be factors, particularly in forming a clean non-scattering interface will be important.

The height H1 or thickness of the non-superconducting metal 502 can range from about 10-1000 nanometers (nm), with approximately 200 nm preferred (but not a necessity).

Figure 7:
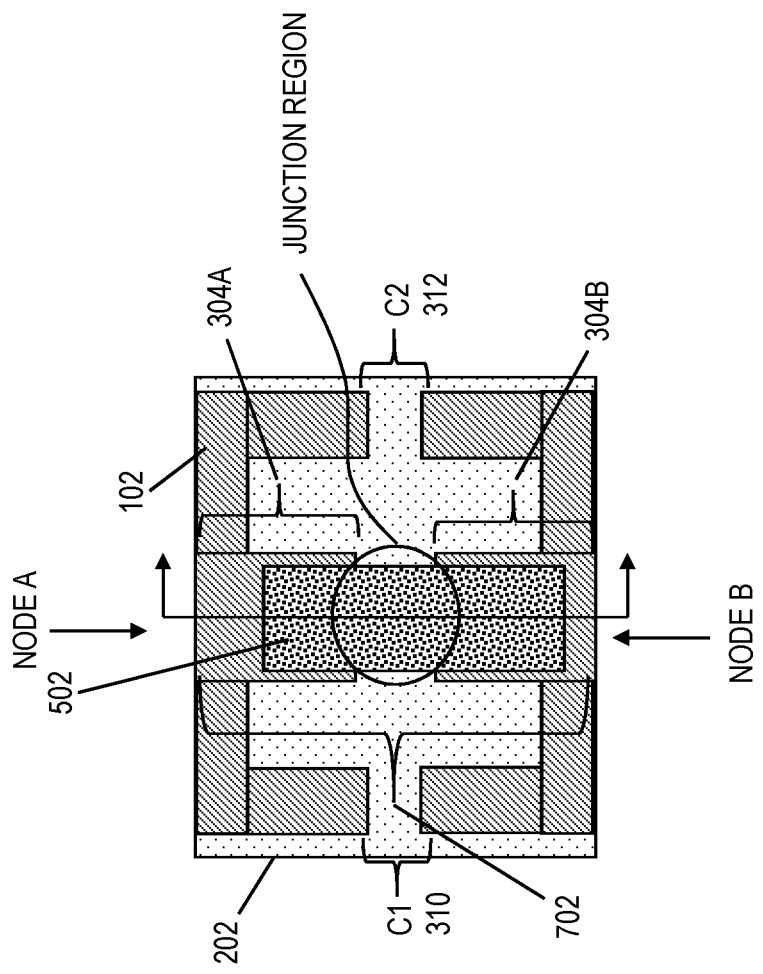
FIG. 7 depicts a top view of fabricating a superconducting qubit 100 according to embodiments of the present invention.
Figure 8:
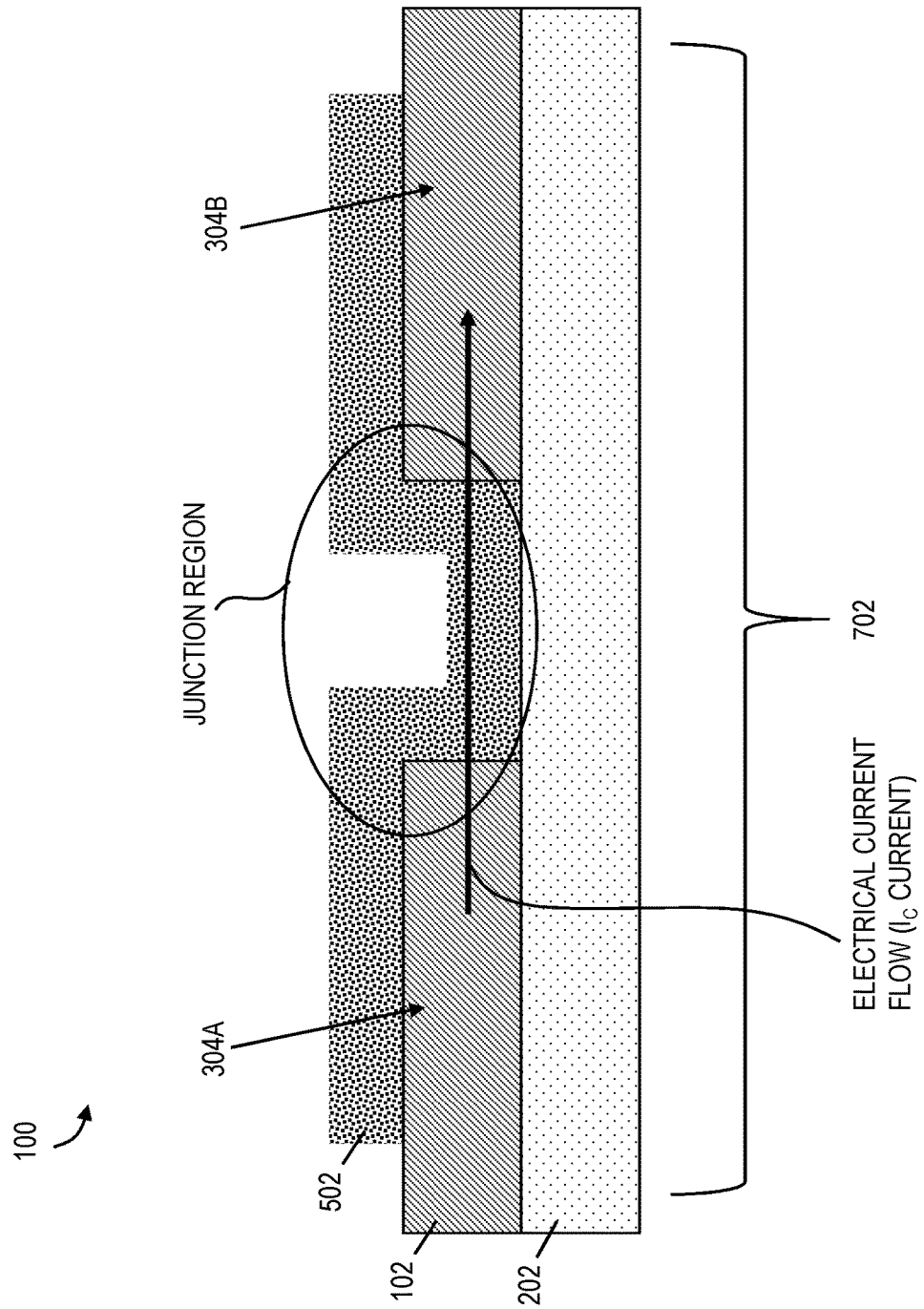
FIG. 8 depicts a cross-sectional view of FIG. 7 according to embodiments of the present invention.

FIG. 7 depicts a top view of fabricating the superconducting qubit 100 according to embodiments of the present invention. FIG. 8 depicts a cross-sectional view of FIG. 7 according to embodiments of the present invention.

The non-superconducting metal 502 is patterned to be only in the junction region, thereby forming a Josephson junction 702. The junction region is between the two superconducting electrodes 304A and 304B. The Josephson junction 702 is formed of the superconducting electrode 304A, the non-superconducting metal 502, and the superconducting electrode 304B. A portion of the non-superconducting metal 502 may or may not remain on top of the superconducting electrodes 304A and 304B. The non-superconducting metal 502 is removed from other parts of the substrate 202 and the superconducting metal 102. In some embodiments of the present invention, non-superconducting metal 502 can be patterned to only remain in the space 302. In some embodiments of the present invention, non-superconducting metal 502 can be patterned to completely cover (or cover over 80%, 90%, etc.) of the superconducting electrodes 304A and 304B.

In order to pattern the tunnel junction which is the non-superconducting metal 502, lithography is performed (e.g., a photoresist can be deposited and patterned) and the tunneling metal is etched selectively to superconducting metal 102 and silicon (e.g., the substrate 202) in accordance with the pattern formed using lithography. Therefore, the desired part of the non-superconducting metal 502 is removed while leaving (or not etching) the superconducting metal 102 and silicon (e.g., the substrate 202). For example, Cu (as the non-superconducting metal 502) can be etched selectively to TiN (as the superconducting metal 102) using a number of commercial etchants. Example commercial etchants can include a chromium etchant CR-7 by Cyantek Corporation (merged with KMG Electronic Chemicals), an aluminum etchant Etch A from Transene Company, Inc, or a copper etchant from Transene Company, Inc.

As an arbitrary direction to illustrate electrical flow of the critical/superconducting current $I_c$ at superconducting temperatures in FIG. 8, critical current $I_c$ can flow from the superconducting electrode 304A, into the non-superconducting metal 502, tunnel through the non-superconducting metal 502 in the junction region, and back into the superconducting electrode 304B. Using the techniques discussed herein, nominally identical superconducting qubits 100 (or nominally identical superconducting qubits 900 discussed below) can be formed with the same or nearly the same value for their respective critical currents $I_c$, thereby having a smaller spread of values for their critical currents $I_c$ than critical currents $I_c$ for nominally identical state-of-the-art qubits with superconductor insulator superconductor Josephson junctions.

Figure 9:
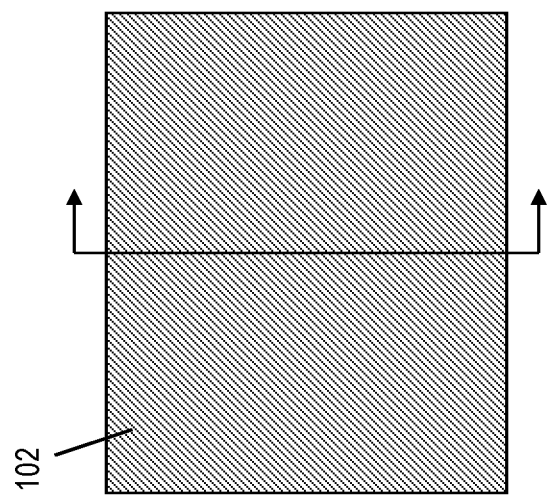
FIG. 9 depicts a top view of fabricating the superconducting qubit according to embodiments of the present invention.
Figure 10:
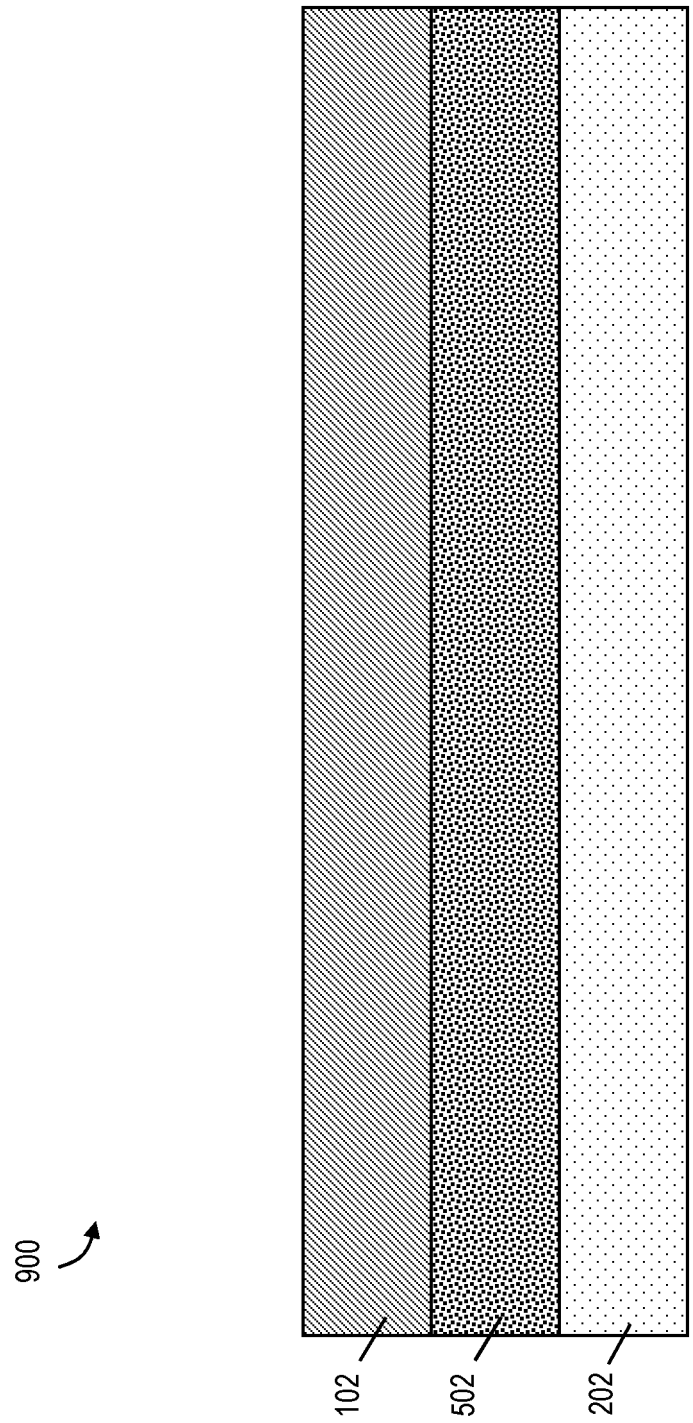
FIG. 10 depicts a cross-sectional view of FIG. 9 according to embodiments of the present invention.

FIGS. 9-14 depict fabrication of a superconducting qubit 900 according to embodiments of the present invention. FIG. 9 depicts a top view of fabricating the superconducting qubit 900 according to embodiments of the present invention. FIG. 10 depicts a cross-sectional view of FIG. 9 according to embodiments of the present invention. Fabrication of the superconducting qubit 900 uses a bilayer process, in which tunnel barrier material which is a non-superconducting material is deposited before/below the contacts (i.e., superconducting electrodes).

The non-superconducting metal 502 is deposited on top of the substrate 202. The superconducting material 102 is deposited on top of non-superconducting metal 502. As noted above, the non-superconducting metal 502 can be copper (Cu), platinum (Pt), etc. Other examples of other suitable tunneling non-superconducting metal 502 can include Au, Ag, Pd, etc. Non-limiting examples of the superconducting material 102 include material such as niobium (Nb), aluminum (Al), titanium nitride (TiN), and other suitable superconductors.

Figure 11:
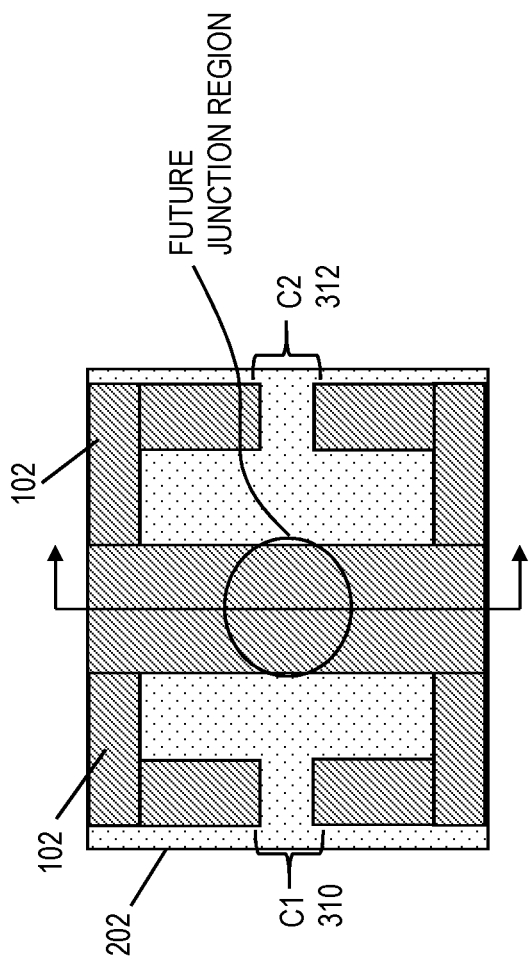
FIG. 11 depicts a top view of fabricating a superconducting qubit according to embodiments of the present invention.
Figure 12:
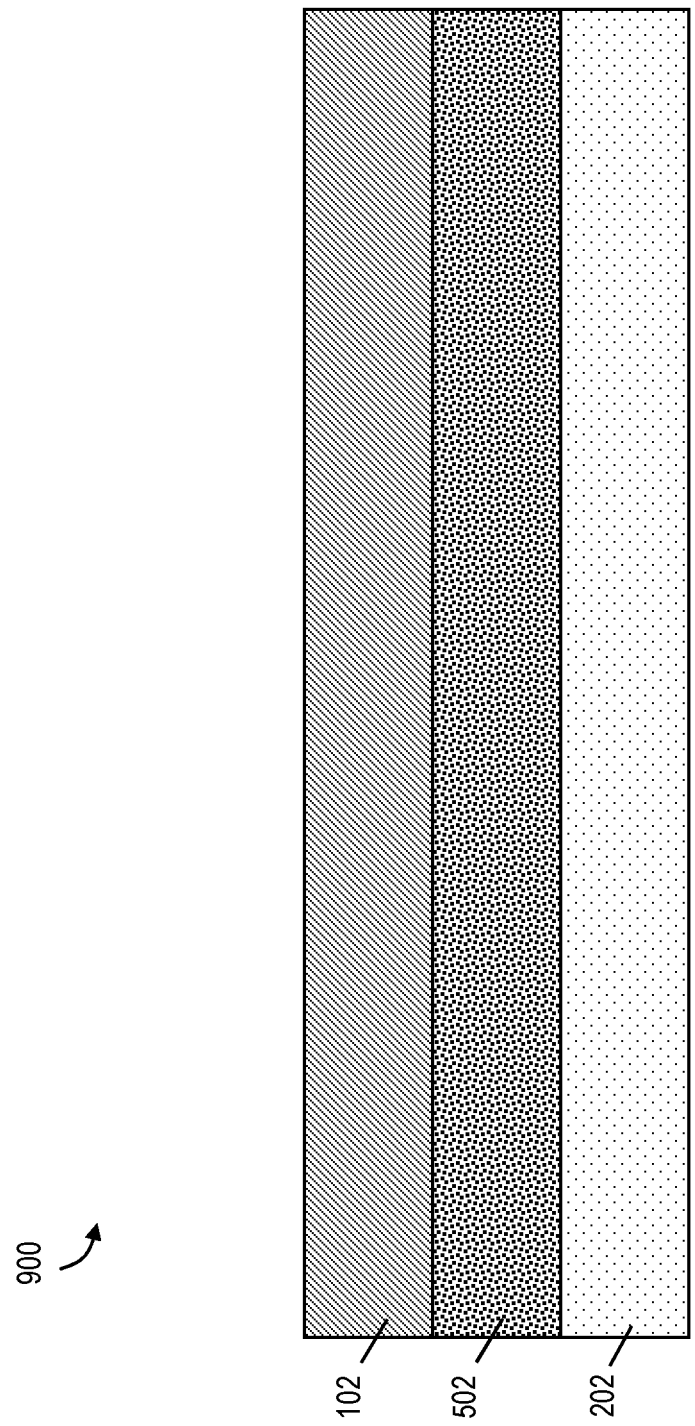
FIG. 12 depicts a cross-sectional view of FIG. 11 according to embodiments of the present invention.

FIG. 11 depicts a top view of fabricating the superconducting qubit 100 according to embodiments of the present invention. FIG. 12 depicts a cross-sectional view of FIG. 11 according to embodiments of the present invention. Both the superconducting material 102 and the non-superconducting metal 502 are patterned. Although each element associated with the superconducting qubit 100 is not shown so as not to obscure the figure, the fabrication process also patterns readout resonators, ground plane, capacitors, and/or junction contacts with a single-step lithography and subsequent etching. For example, lithography (using, e.g., a patterned photoresist) is performed to lay out a pattern for the non-superconducting metal 502 and superconducting metal 102, and the etching of the superconducting material 102 (e.g., TiN, Nb) and the non-superconducting metal 102 (Cu) can be accomplished with $Cl_2$ based etchants during reactive ion etching (RIE). FIG. 11 shows that the shunting capacitors 310 C1 and 312 C2 are formed. As noted above, both shunting capacitors might not be needed and only one of the shunting capacitors 310 C1 and 312 C2 might be utilized in some embodiments of the present invention. At this point, it is noted that the patterning still leaves a shorted junction, and the junction will be subsequently patterned. In some embodiments of the present invention, the junction can be formed at this time. It is noted that this is just an example sequence of patterning for some embodiments of the invention. In other embodiments of the invention, it might be beneficial to only form the junction at some later point in time since the Josephson junction will be protected until final fabrication.

Figure 13:
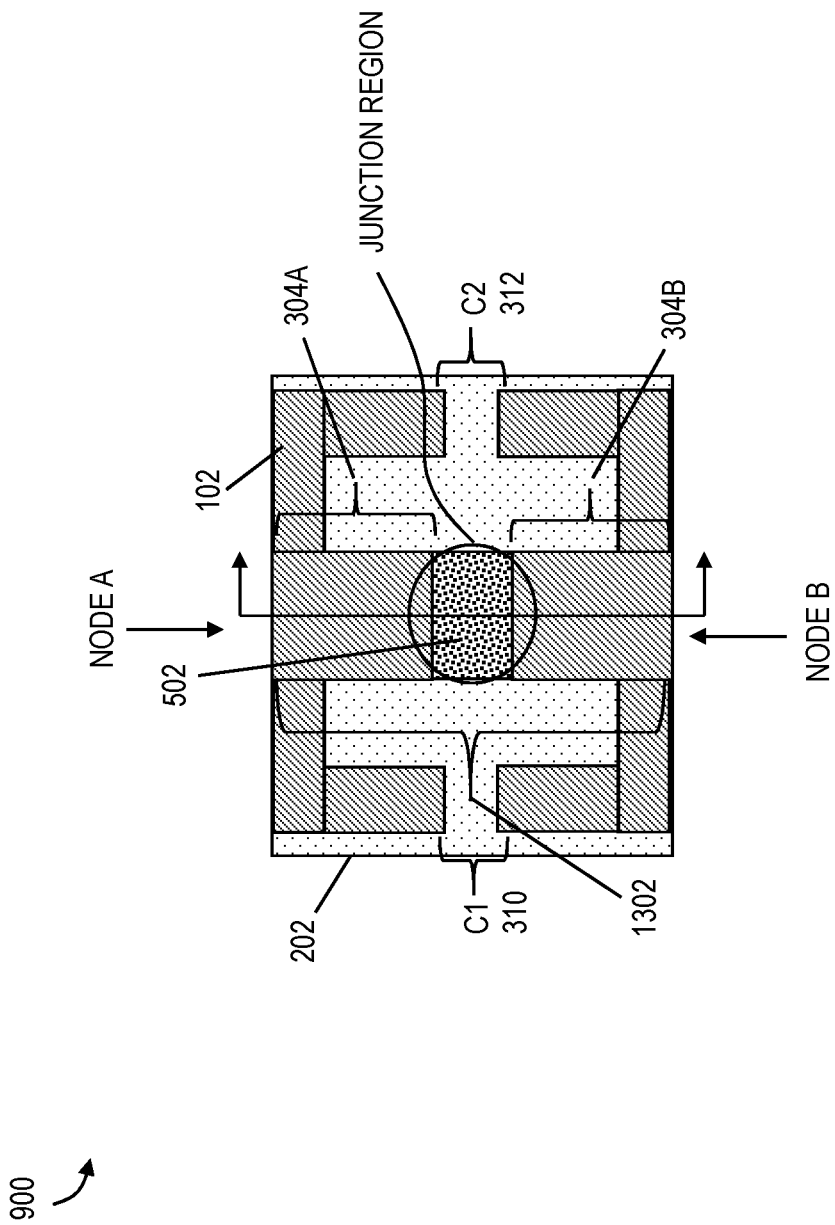
FIG. 13 depicts a top view of fabricating a superconducting qubit according to embodiments of the present invention.
Figure 14:
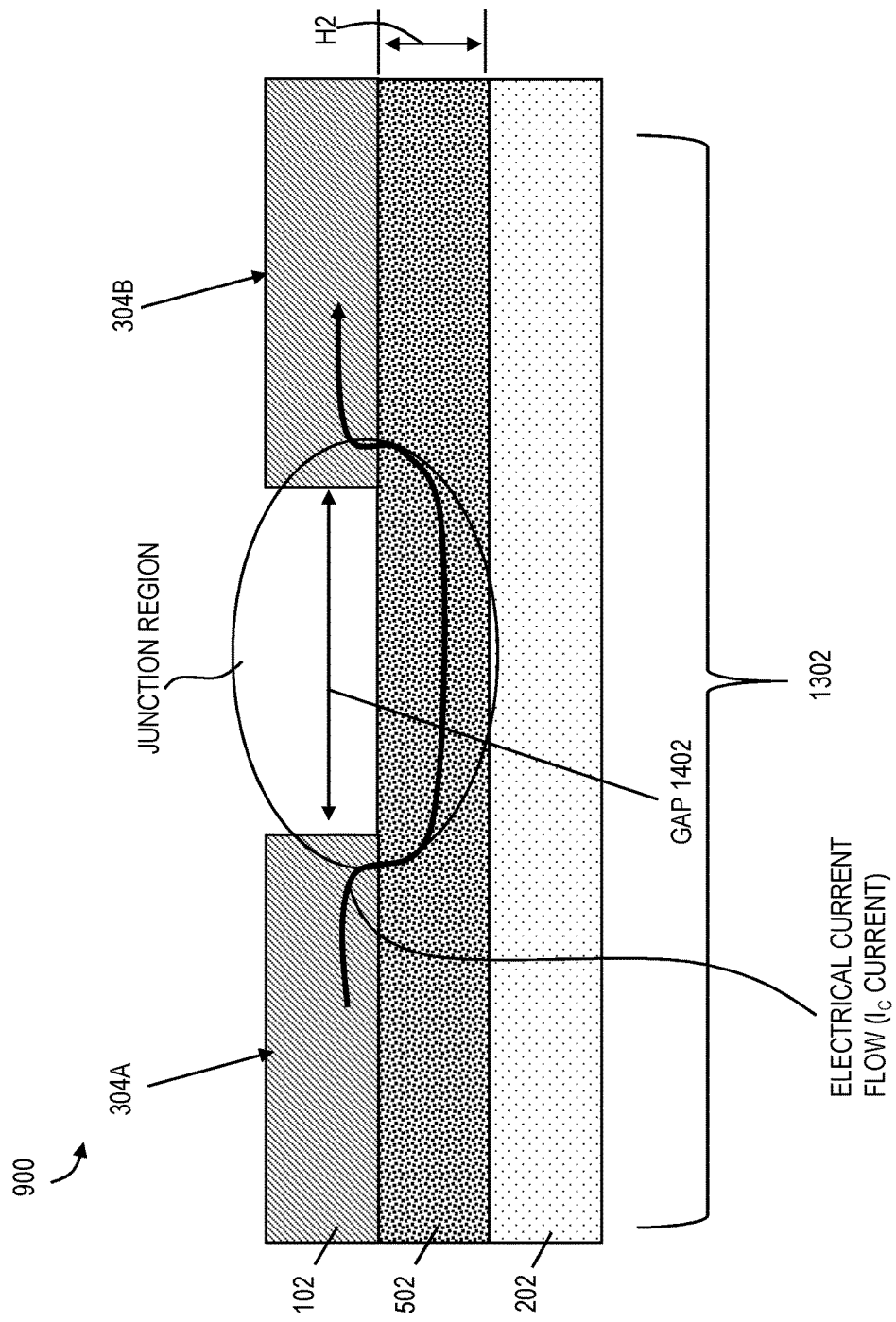
FIG. 14 depicts a cross-sectional view of FIG. 13 according to embodiments of the present invention.

FIG. 13 depicts a top view of fabricating the superconducting qubit 900 according to embodiments of the present invention. FIG. 14 depicts a cross-sectional view of FIG. 13 according to embodiments of the present invention.

The superconducting metal 102 is patterned in the junction region to form a gap 1402 and to form superconducting electrodes 304A and 304B, thereby forming a Josephson junction 1302. The junction region is between but below the two superconducting electrodes 304A and 304B. The Josephson junction 1302 is formed of the superconducting electrode 304A, the below non-superconducting metal 502, and the superconducting electrode 304B.

To pattern the gap 1402 in the contacts (i.e., superconducting electrodes 304A and 304B), lithography is performed (e.g., using a photoresist) and reactive ion etching is performed to selectively etch the superconductor material 102 and not the tunneling metal beneath (i.e., the non-superconducting metal 502). For example, TiN (superconductor material 102) can be etched selectively to Cu (non-superconducting metal 502) using a number of commercial etchants such as DuPont™ CuSolve™ EKC™ 575.

The height H2 or thickness of the non-superconducting metal 502 can range from about 10-1000 nm, preferably (but not a necessity) 200 nm.

As an arbitrary direction to illustrate electrical flow of the critical/superconducting current $I_c$ at superconducting temperatures in FIG. 14, critical current can flow from the superconducting electrode 304A, down to the non-superconducting metal 502 below, tunnel through the non-superconducting metal 502 in the junction region, and back up into the superconducting electrode 304B. As can be recognized there is no tunnel barrier in the gap 1402 as would be placed in the state-of-the-art. Rather, the critical current travels below the gap 1402 in the non-superconducting metal 502 underneath. The portions of the non-superconducting metal 502 underneath the edges of the superconducting electrodes 304A and 304B closest to the gap 1402 act as the tunnel barrier along with the non-superconducting metal 502 underneath the gap 1402.

Figure 15:
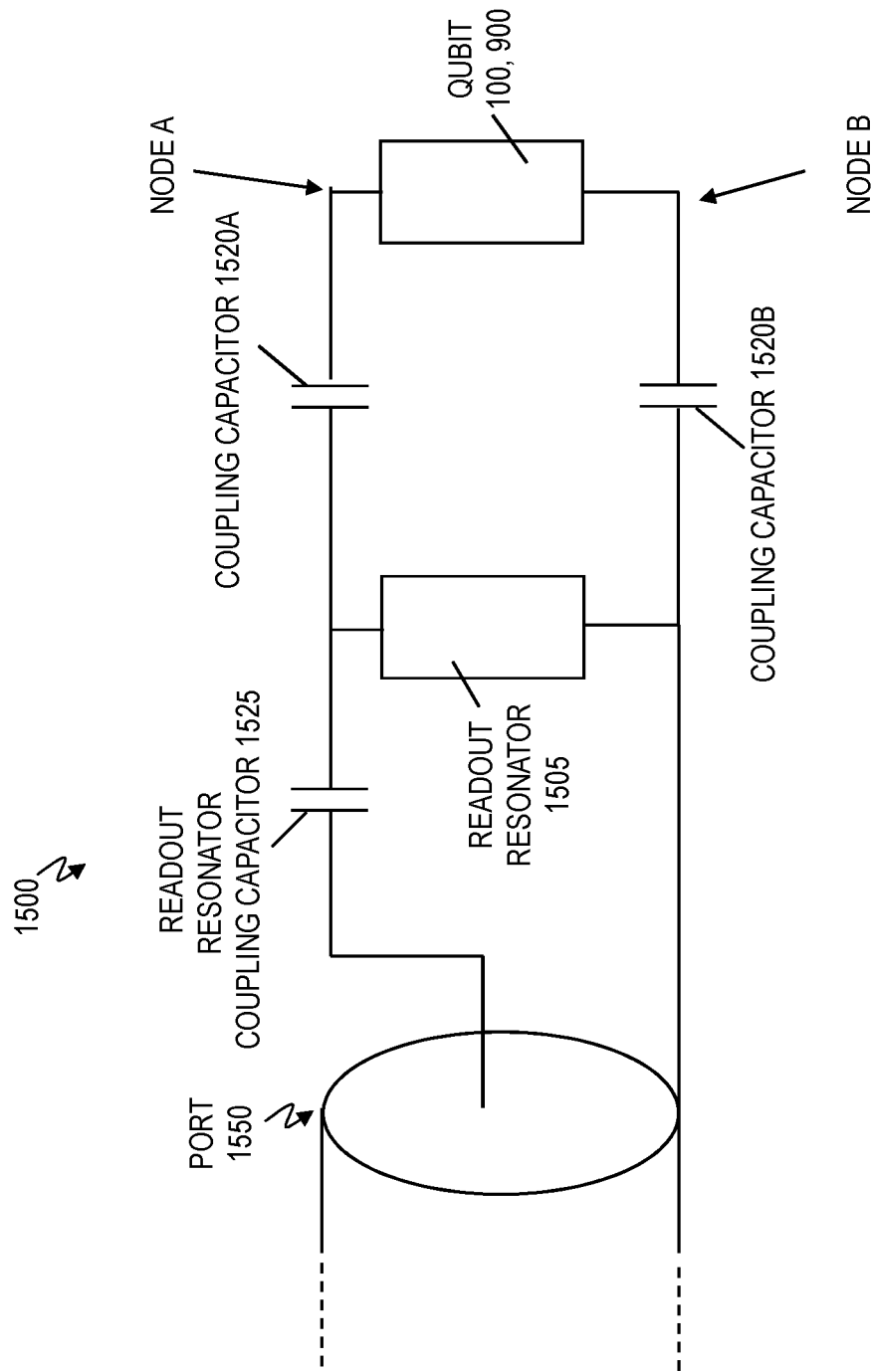
FIG. 15 depicts a schematic of a microwave device that can be utilized in quantum computing according to embodiments of the present invention.

In circuit quantum electrodynamics, quantum computing employs nonlinear superconducting devices (i.e., qubits) to manipulate and store quantum information, and resonators (e.g., as a two-dimensional (2D) planar waveguide or as a three-dimensional (3D) microwave cavity) to read out and/or facilitate interaction among qubits. As one example, each superconducting qubit include one or more Josephson junctions shunted by capacitors in parallel with the junctions. The qubits are capacitively coupled to 2D or 3D microwave cavities. The electromagnetic energy associated with the qubit is stored in the Josephson junctions and in the capacitive and inductive elements forming the qubit. FIG. 15 depicts a schematic of a microwave device 1500 that can be utilized in quantum computing according to embodiments of the present invention. The microwave device 1500 includes the superconducting qubit 100 or 900. One microwave device 1500 is shown as an example, and it should be understood that numerous microwave devices 1500 can be included in a quantum computer as understood by one skilled in the art. The microwave device 1500 can be utilized to energize (i.e., drive) and read out the superconducting qubit 100, 900. In this example, the superconducting qubit 100, 900 can be energized and read out in reflection. In other implementations, the superconducting qubit 100, 900 can be energized and read out in transmission as understood by one skilled in the art.

The microwave device 1500 includes the qubit 100 or 900 capacitively coupled to the readout resonator 1505 by coupling capacitors 1520A and 1520B. The readout resonator 1505 can be representative of a 2D planar waveguide or a 3D microwave cavity. The readout resonator 1505 is capacitively coupled to a port 1550 by resonator coupling capacitor

1525. The port 1550 is for the microwave device 1500 to receive microwave signals (e.g., the qubit drive signal to energize the qubit 100, 900 and resonator readout signal to read out the readout resonator 1505 thereby reading out the state of the qubit 100, 900) and for measuring microwave signals reflected from the readout resonator 1505 (i.e., receiving the state of the qubit 100, 900).

Figure 16:
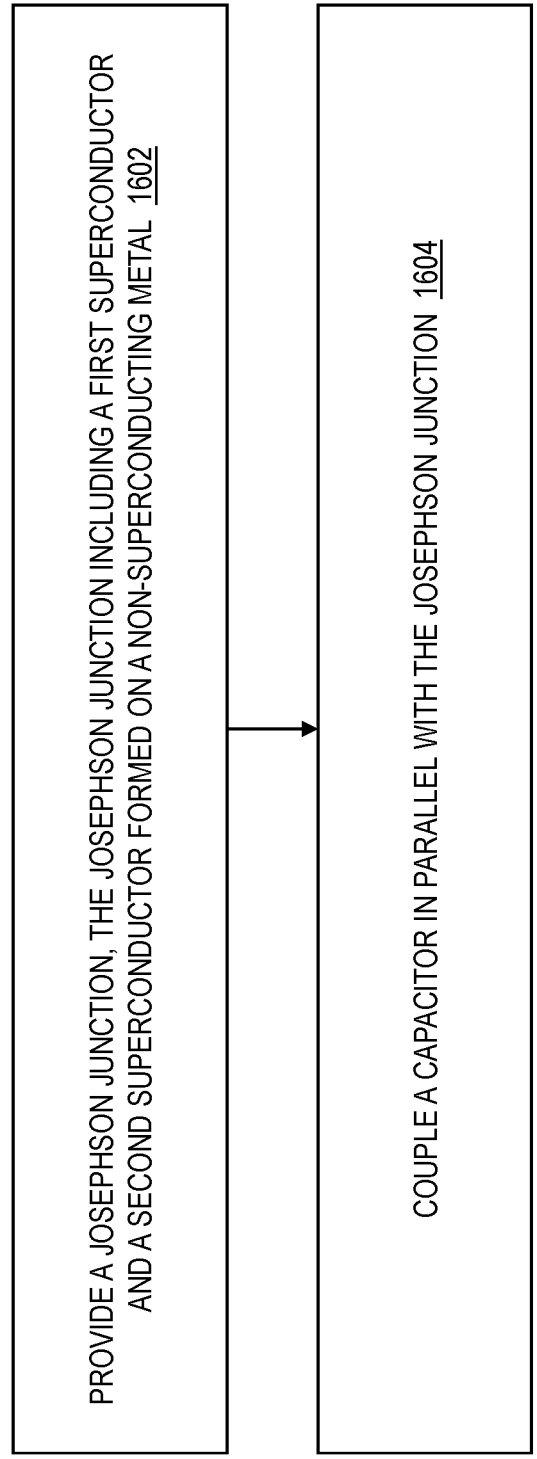
FIG. 16 depicts a flow chart of a method of fabricating a superconducting qubit according to embodiments of the present invention.

FIG. 16 depicts a flow chart 1600 of a method of fabricating a superconducting qubit 900 according to embodiments of the present invention. At block 1602, a Josephson junction 1302 is provided which includes a first superconductor 304A and a second superconductor 304B formed on a non-superconducting metal 502. At block 1604, a shunting capacitor (e.g., capacitor C1 310, capacitor C2 312, or both capacitors C1 and C2) is coupled in parallel with the Josephson junction 1302.

The first superconductor 304A and the second superconductor 304B are separated from one another. The first superconductor and the second superconductor have a space (e.g., gap 1402) separating one from another. The space (gap 1402) is about 0.1-10 □m. The non-superconducting metal is formed on a semiconductor. The non-superconducting metal is copper. The non-superconducting metal is platinum.

FIG. 17 depicts a flow chart 1700 of a method of fabricating a superconducting qubit 100 according to embodiments of the present invention. At block 1702, a Josephson junction 702 is provided which includes a non-superconducting metal 502 formed between a first superconductor 304A and a second superconductor 304B. At block 1704, a shunting capacitor (e.g., capacitor C1 310, capacitor C2 312, or both capacitors C1 and C2) is coupled in parallel with the Josephson junction 702.

The non-superconducting metal 502 is formed on top a part of both the first superconductor 304A and the second superconductor 304B. The non-superconducting metal 502, the first superconductor 304A, and the second superconductor 304B are each formed on a portion of a substrate 202. The first superconductor 304A and the second superconductor 304B are separated from one another by a gap 302. The distance of the gap 302 can range from about 0.1-10 □m. The non-superconducting metal is formed on silicon. The non-superconducting metal is copper. The non-superconducting metal is platinum.

Figure 18:
FIG. 18 depicts a flow chart of forming a microwave device according to embodiments of the present invention.

FIG. 18 depicts a flow chart 1800 of a method of forming a microwave device 1500 according to embodiments of the present invention. At block 1802, a superconducting qubit 100 or 900 is provided in which the superconducting qubit 100, 900 includes a Josephson junction 702, 1302 having a first superconductor 304A, a second superconductor 304B, and a non-superconducting metal 502. At block 1804, a readout resonator 1505 is coupled to the superconducting qubit 100, 900.

The circuit elements of the circuits 100, 702, 1500 can be made of superconducting material. The respective resonators and transmission/feed/pump lines are made of superconducting materials. Examples of superconducting materials (at low temperatures typically ranging from 0.1 to 20 kelvin (K)) include niobium, aluminum, tantalum, etc. For example, the proximity effect junctions are made of superconducting material, and the tunneling region is made of a non-superconducting metal. The capacitors can be made of superconducting material separated by vacuum as opposed to (typically lossy) dielectric. The transmission lines (i.e., wires) connecting the various elements are made of a superconducting material.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a superconducting qubit comprising:
   providing a Josephson junction, the Josephson junction including a first superconductor and a second superconductor formed on a non-superconducting metal; and
   coupling a capacitor in parallel with the Josephson junction, the capacitor being a separate structure from the first superconductor and the second superconductor forming the Josephson junction.

2. The method of claim 1, wherein the first superconductor and the second superconductor are separated from one another.

3. The method of claim 1, wherein a space separates the first superconductor and the second superconductor.

4. The method of claim 3, wherein a dimension of the space is about 0.1-10 microns.

5. The method of claim 1, wherein the non-superconducting metal is formed on a semiconductor.

6. The method of claim 1, wherein the non-superconducting metal comprises copper.

7. The method of claim 1, wherein the non-superconducting metal comprises platinum.

8. A method of fabricating a superconducting qubit comprising:
   providing a Josephson junction, the Josephson junction including a non-superconducting metal formed between a first superconductor and a second superconductor; and
   coupling a capacitor in parallel with the Josephson junction, the capacitor being a separate structure from the first superconductor and the second superconductor forming the Josephson junction.

9. The method of claim 8, wherein the non-superconducting metal is formed on top a part of both the first superconductor and the second superconductor.

10. A method of forming a microwave device comprising:
    providing a superconducting qubit, the superconducting qubit including a Josephson junction having a first superconductor, a second superconductor, and a non-superconducting metal; and
    coupling a readout resonator to the superconducting qubit.

11. The method of claim 1, wherein the capacitor is formed at a separate location on the non-superconducting metal from the first superconductor and the second superconductor forming the Josephson junction.

* * * * *